US012767525B2

(12) United States Patent
Wasisto et al.

(10) Patent No.: US 12,767,525 B2
(45) Date of Patent: Oct. 20, 2026

(54) PRESSURE TRANSDUCER DEVICE WITH HYBRID BARRIER STRUCTURE AND METHOD FOR MANUFACTURING SAME

(71) Applicant: Infineon Technologies AG, Neubiberg (DE)

(72) Inventors: Hutomo Suryo Wasisto, Munich (DE); Marc Füldner, Neubiberg (DE); Dominic Maier, Pleystein (DE); Andreas Wiesbauer, Pörtschach a. W. (AT); Sebastian Anzinger, Miesbach (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 440 days.

(21) Appl. No.: 18/512,582

(22) Filed: Nov. 17, 2023

(65) Prior Publication Data

US 2024/0182295 A1 Jun. 6, 2024

(30) Foreign Application Priority Data

Dec. 1, 2022 (EP) .................................... 22210906

(51) Int. Cl.
*B81B 7/02* (2006.01)
*H10W 72/00* (2026.01)
*H10W 90/00* (2026.01)

(52) U.S. Cl.
CPC ........ *B81B 7/02* (2013.01); *B81B 2201/0257* (2013.01); *H10W 72/884* (2026.01); *H10W 90/753* (2026.01)

(58) Field of Classification Search
CPC .... B81B 2201/0257; B81B 2201/0264; B81B 7/0061; B81B 7/0025; B81B 7/0029; B81B 7/0038; B81B 7/0048; B81B 7/0058; B81B 7/008; B81B 7/009; B81B 7/02; B81B 7/04; B81B 3/0067; H10W 90/275; H10W 90/28; H10W 90/731; H10W 90/732; H10W 90/752; H10W 90/753; H10W 72/884; H10W 72/886; H10W 72/889; H10W 72/934; H10W 72/941; H04R 19/00; H04R 31/00; H10N 30/08; H10N 30/082; H10N 30/089; H10N 30/2047; H10N 30/302; H10N 30/308; H10N 30/88; H10N 30/883;
(Continued)

(56) References Cited

U.S. PATENT DOCUMENTS 8,121,315 B2 * 2/2012 Song ...................... H04R 19/04
381/174
8,447,057 B2 * 5/2013 Goida ...................... H04R 1/02
381/361

(Continued)

*Primary Examiner* — Natalia A Gondarenko
(74) *Attorney, Agent, or Firm* — Slater Matsil, LLP

(57) ABSTRACT

A method for manufacturing a MEMS pressure transducer chip with a hybrid integrated environmental barrier structure includes a step of providing a substrate comprising at least one membrane, a step of structuring a stepped recess structure into the substrate, the stepped recess structure comprising a first recess having a first lateral width and an adjacent second recess having a larger second lateral width, where the stepped recess structure extends between the membrane and a substrate surface opposite to the membrane, and a step of arranging an environmental barrier structure inside the second recess.

20 Claims, 10 Drawing Sheets

(58) Field of Classification Search

CPC ............ B81C 1/00595; B81C 1/00587; B81C 1/00523–00571; B81C 1/00388–00634; B81C 1/0015; B81C 1/00103; B81C 1/00119; B81C 2203/00–0792; B81C 2203/0707–0778; B81C 99/00–0095; B81C 1/00095; B81C 1/00031; B81C 1/00023–00126; B81C 1/00246; B81C 1/0069; B81C 1/00698; B81C 1/0065–00682; B81C 1/00055–00087; B81C 1/00841–00857; B81C 1/00936; B81C 1/00944

USPC .......... 257/416, 254, 415, 417, 470, 29.324, 257/29.347, 21.231; 438/29, 46, 51, 50, 438/54, 57, 482, 478, 19, 760

See application file for complete search history.

(56) References Cited

U.S. PATENT DOCUMENTS

| | | | | |
|---|---|---|---|---|
| 9,769,554 | B2 * | 9/2017 | Brioschi | H04R 1/086 |
| 2012/0237073 | A1 | 9/2012 | Goida et al. | |
| 2016/0304337 | A1 * | 10/2016 | Miao | B81C 1/00158 |
| 2018/0159017 | A1 * | 6/2018 | Mills | G01L 9/0005 |
| 2019/0145806 | A1 * | 5/2019 | Lim | G01L 9/0073<br>73/861.27 |
| 2019/0215587 | A1 * | 7/2019 | Klein | H04R 19/02 |
| 2022/0369042 | A1 | 11/2022 | Westmarland et al. | |

* cited by examiner

PRESSURE TRANSDUCER DEVICE WITH HYBRID BARRIER STRUCTURE AND METHOD FOR MANUFACTURING SAME

This application claims the benefit of European Patent Application No. 22210906.8, filed on Dec. 1, 2022, which application is hereby incorporated herein by reference.

TECHNICAL FIELD

Embodiments of the present disclosure relate to a microelectromechanical system (MEMS)-based pressure transducer chip with an integrated environmental barrier structure for protecting the membrane of the MEMS pressure transducer from interfering environmental substances (e.g., aerosols, salt particles, hairs, moisture (water droplets), oil, and other liquids).

BACKGROUND

A microelectromechanical system—MEMS—is a miniaturized system that comprises a very small form factor. For example, a pressure transducer may be provided as MEMS, wherein a small membrane may transduce its mechanical oscillations into electric signals, or vice versa. An example of a MEMS pressure transducer may be a tire pressure sensor that monitors the air pressure in tires. A further example may be a MEMS microphone that transduces sound waves (as an example of air pressure), such as music or voice, into electric signals, which can then be converted into digital data using an application-specific integrated circuit (ASIC). In the reverse direction, a MEMS speaker may convert digital data into sound by oscillating the membrane.

SUMMARY

One disclosed aspect concerns a method for manufacturing a MEMS pressure transducer chip with a hybrid integrated environmental barrier structure. The method includes a step of providing a substrate comprising at least one membrane. The method further includes a step of creating a stepped recess structure into the substrate, in which the stepped recess structure includes a first recess having a first lateral width and an adjacent second recess having a larger second lateral width. The stepped recess structure extends between the membrane and a substrate surface opposite to the membrane. The method further includes a step of arranging an environmental barrier structure inside the second recess.

A further disclosed aspect concerns a MEMS pressure transducer chip obtainable by the method. The MEMS pressure transducer chip includes a substrate comprising at least one membrane. The substrate includes a stepped recess structure, the stepped recess structure comprising a first recess having a first lateral width and an adjacent second recess having a larger second lateral width. The stepped recess structure extends between the membrane and a substrate surface opposite to the membrane. The MEMS pressure transducer chip further includes an environmental barrier structure arranged inside the second recess.

BRIEF DESCRIPTION OF THE DRAWINGS

In the following, embodiments of the present disclosure are described in more detail with reference to the figures, in which.

DETAILED DESCRIPTION OF ILLUSTRATIVE EMBODIMENTS

Figure 1A:
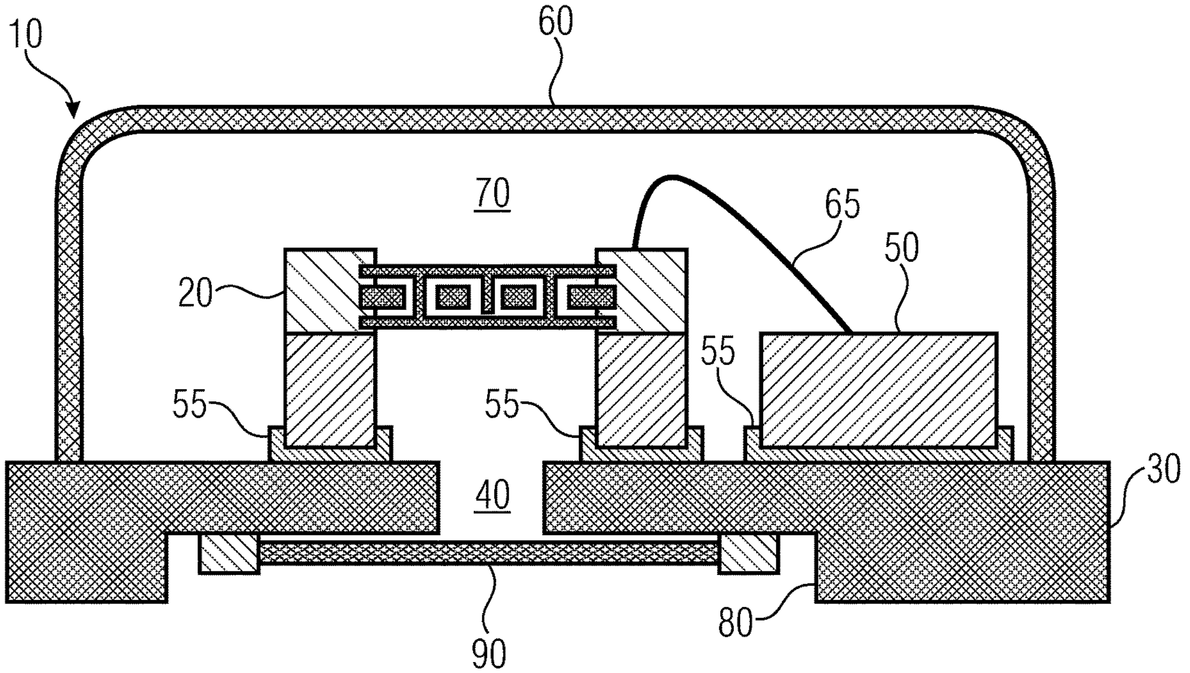
Fig. 1A PRIOR ART
FIG. 1A shows a prior art schematic side view of a conventional MEMS pressure transducer package.

Equal or equivalent elements or elements with equal or equivalent functionality are denoted in the following description by equal or equivalent reference numerals.

Method steps, which are depicted by means of a block diagram and described with reference to the block diagram, may also be executed in an order different from the depicted and/or described order. Furthermore, method steps concerning a particular feature of a device may be replaceable with the feature of the device, or vice versa. Certain method steps may be rearranged or omitted in various embodiments.

Owing to their miniaturized size, MEMS pressure transducers can be made with environmental protection because such pressure transducers can be influenced by several physical and chemical interfering objects from the surrounding environment, in particular interfering environmental substances (e.g., aerosols, salt particles, hairs, moisture (water droplets), oil, and other liquids), which can then lead to lower robustness level and shorter operation time.

MEMS pressure transducer chips may be equipped with some external environmental barrier structures, like a mesh or a membrane. For example, the MEMS pressure transducer chip may be housed inside a MEMS package being arranged on a printed circuit board (PCB). A vent hole may be provided in the PCB for allowing environmental air pressure to enter the MEMS package. Some meshes or membranes may cover the vent hole, where the meshes or membranes may be positioned inside or outside the MEMS package.

Despite having positioning flexibility when integrating the mesh or membrane with the package, some implementations might result in additional effort and complexity with respect to logistics and integration concepts, in particular if the environmental barrier is externally procured. In case the environmental barrier is placed inside the MEMS package, the environmental barrier may be glued between the MEMS chip and the PCB substrate. In other cases, in case the environmental barrier is attached outside the MEMS package, additional laser processing may be indicated in order to create a cavity in the backside of the PCB substrate, in which the environmental barrier is integrated. Both such variants can increase the packaging integration costs. Meanwhile, placing the environmental barrier directly outside the package without creating a laser-process pocket or cavity in the PCB substrate can result in poor surface structure of the package system that may lead to more complex integration in the later applications.

Furthermore, in case of MEMS microphones or speakers, the free space underneath the metal lid of the package defines the so-called 'back volume', which can be important for a good performance of the MEMS microphone or speaker. If the environmental barrier is placed inside the package underneath the lid, the back volume may be reduced, which is undesirable.

A MEMS pressure transducer device with an environmental barrier disclosed herein includes a MEMS pressure transducer chip. A corresponding method for fabricating the MEMS pressure transducer chip is also disclosed.

Figure 1B:
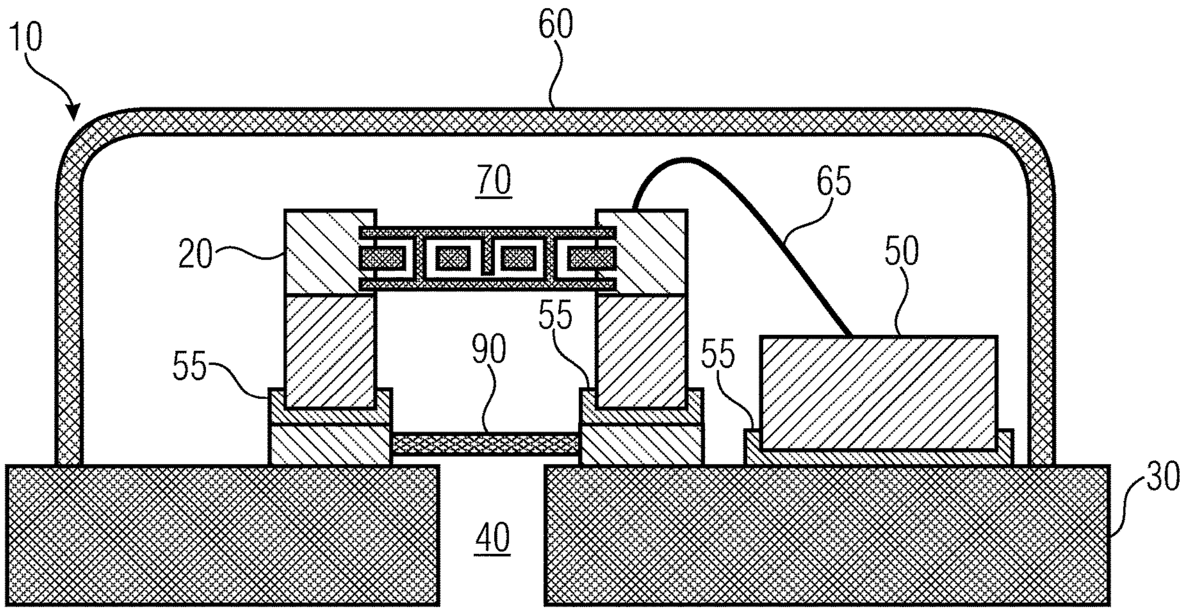
Fig. 1B PRIOR ART
FIG. 1B shows a prior art schematic side view of a further conventional MEMS pressure transducer package.
Figure 1C:
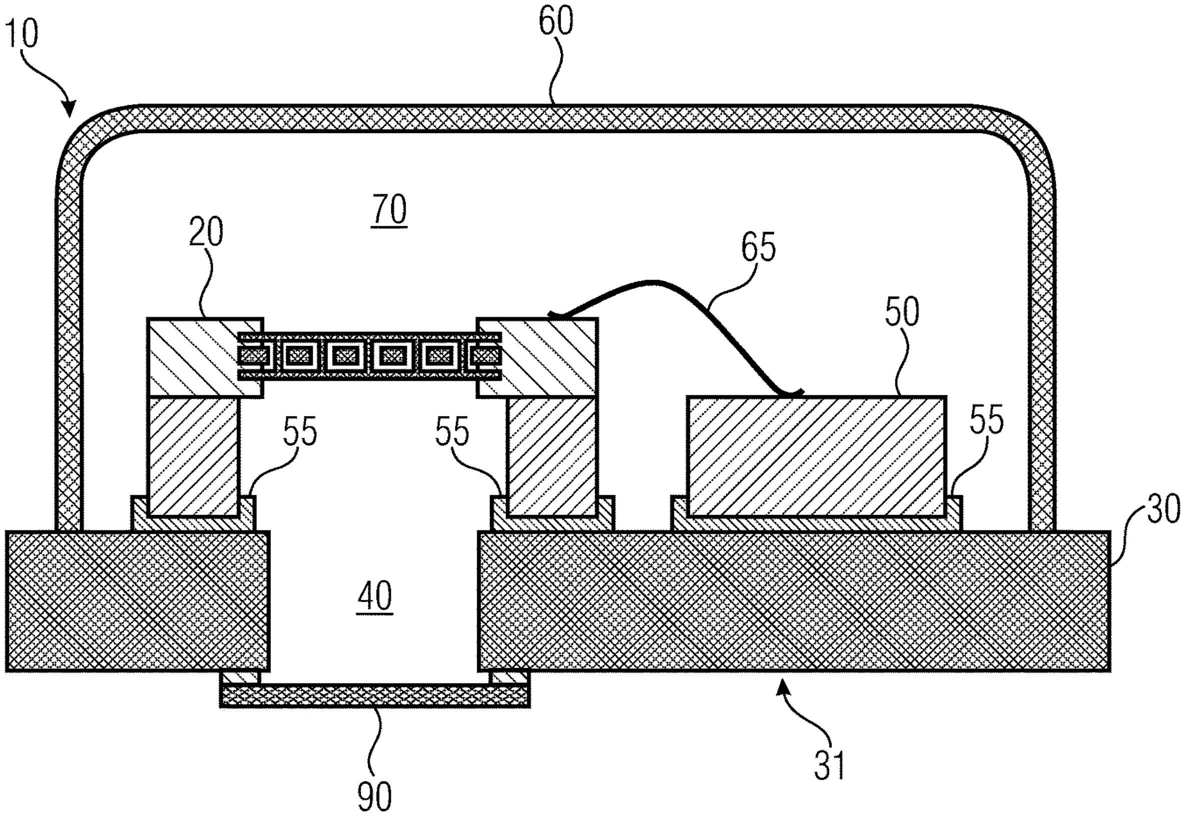
Fig. 1C PRIOR ART
FIG. 1C shows a prior art schematic side view of a further conventional MEMS pressure transducer package.

FIGS. 1A, 1B and 1C show prior art examples of conventional MEMS pressure transducers comprising environmental barriers, as described in the introductory portion above. A MEMS package 10 includes a MEMS pressure transducer chip 20 being mounted on a PCB substrate 30. The PCB substrate 30 includes a vent hole 40 through which ambient air or pressure waves may enter the MEMS package 10. An ASIC 50 is provided adjacent the chip 20. A lid 60 covers the chip 20 and the ASIC 50. The free space 70 underneath the lid 60 defines the back volume.

The ASIC 50 and the MEMS pressure transducer chip 20 are attached to the PCB substrate 30 by means of an adhesive layer 55. The ASIC 50 and the MEMS pressure transducer chip 20 may be electrically connected to each other by means of a bond wire 65.

As depicted in FIG. 1A, the PCB substrate 30 includes a cavity 80 being provided opposite to the lid 50. An environmental barrier 90 is integrated inside the cavity 80 and covers the vent hole 40. For creating the cavity 80 in the backside of the PCB substrate 30, additional laser processing or micromachining has to be applied.

FIG. 1B shows an alternative, in which the environmental barrier 90 is positioned inside the package 10, i.e., in the free space 70 underneath the lid 60. Since the environmental barrier 90 consumes some amount of space, the back volume 70 is accordingly decreased by this amount leading to lower performance of the microphone.

FIG. 1C shows a further alternative, in which the environmental barrier 90 is attached at the backside 31 (opposite to the lid 60) of the PCB substrate 30. In this case, the environmental barrier 90 may protrude from the outer contour of the package 10. Thus, the environmental barrier 90 is prone to damage.

Figure 2A:
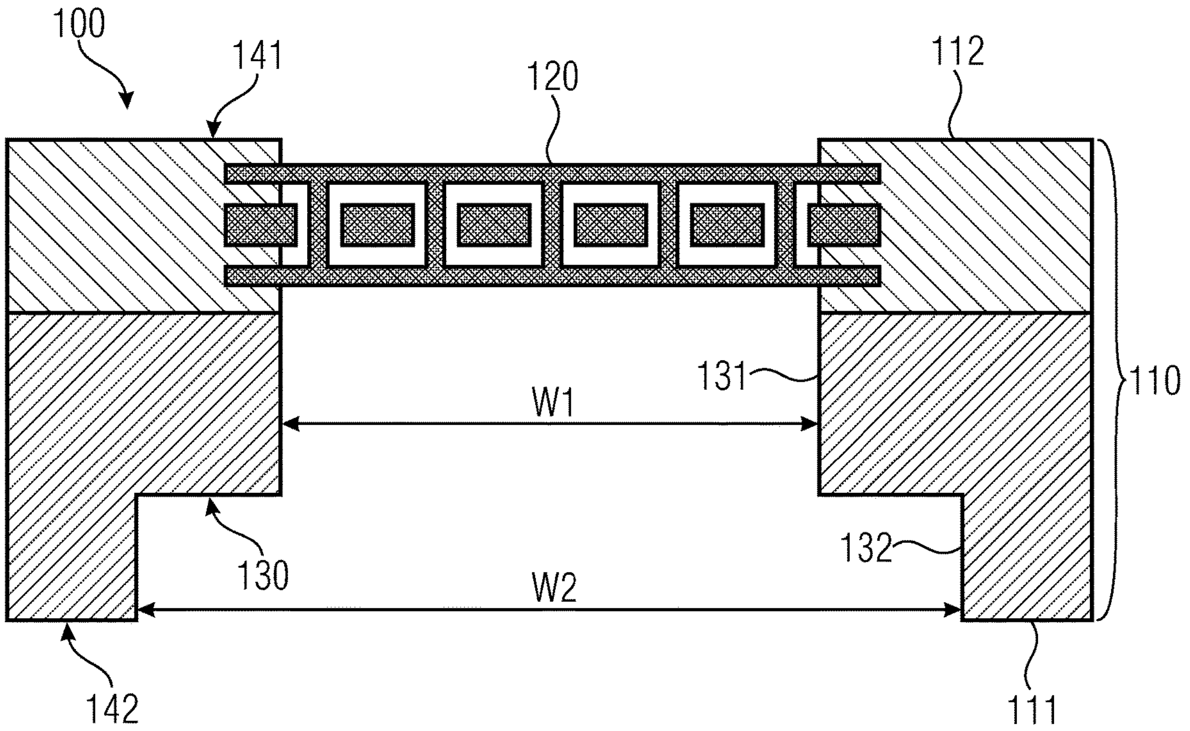
FIGS. 2A-2C show schematic side views of a MEMS pressure transducer chip comprising a hybrid integrated environmental barrier structure according to an embodiment.
Figure 2B:
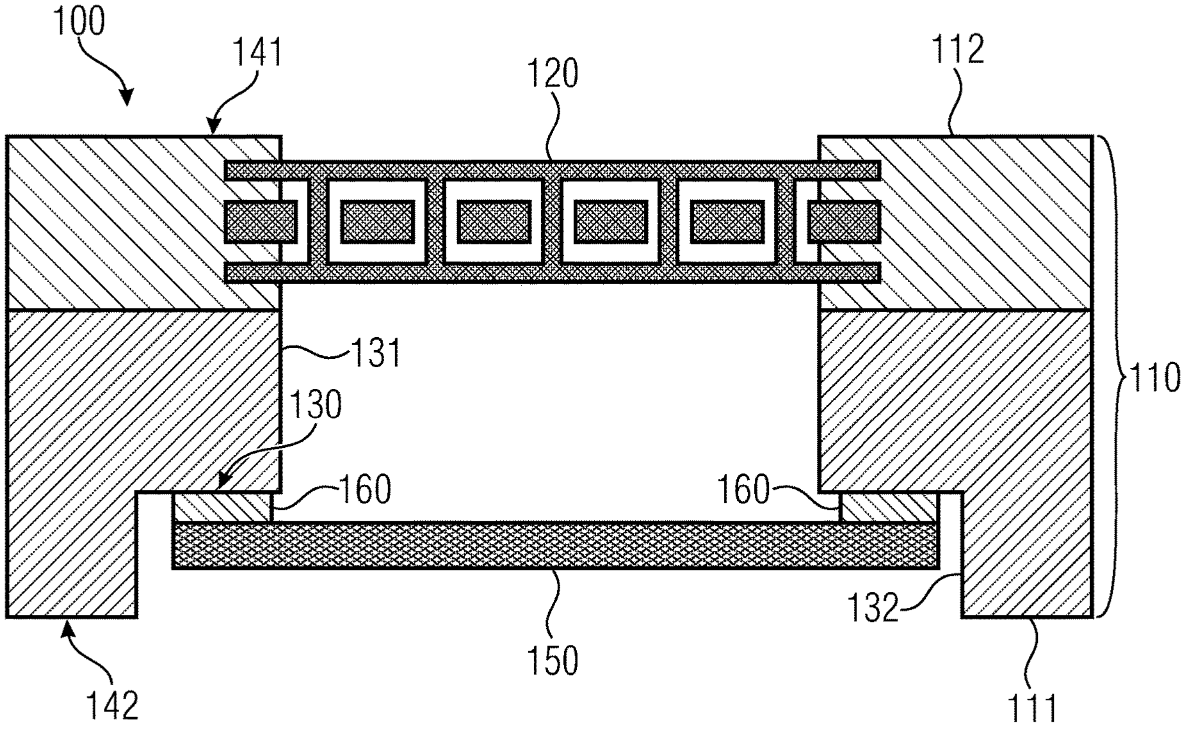

FIGS. 2A and 2B show embodiments of a MEMS pressure transducer chip 100 as disclosed herein. The MEMS pressure transducer chip 100 includes a substrate 110 comprising at least one membrane 120. The substrate 110 may optionally include one or more layers. For example, the substrate 110 may include a first layer 111 and a second layer 112. The first layer 111 may include semiconductor material, for example silicon. The second layer 112 may include a different material, e.g., tetraethyl orthosilicate, formally named tetraethoxysilane (TEOS). The membrane 120 may be provided in the second layer 112.

The substrate 110 further includes a stepped recess structure 130, which may also be referred to as a double backside cavity. The stepped recess structure 130 may be provided in the first layer 111. The stepped recess structure 130 includes a first recess 131, which may also be referred to as a first cavity. The stepped recess structure 130 includes an adjacent second recess 132, which may also be referred to as a second cavity. The first recess 131 has a first lateral width W1, and the second recess 132 has a larger second lateral width W2.

The stepped recess structure 130 extends between the membrane 120 and a substrate surface 142 opposite to the membrane 120. Basically, the substrate 110 may include a first or top surface 141 and an opposite second or bottom surface 142. The membrane 120 may be positioned adjacent to the first surface 141. The stepped recess structure 130 may be provided adjacent to the second surface 142.

As can be seen in FIG. 2B, the MEMS pressure transducer chip 100 further includes an environmental barrier structure 150 being arranged inside the second recess 132. The environmental barrier structure 150 may be arranged inside the second recess 132 such that it covers the first recess 131.

The first recess 131 may be formed as a channel-like through hole vertically extending through the substrate 110 for allowing pressure waves to pass through the first recess 131 and to arrive at the membrane 120. Accordingly, the environmental barrier structure 150 may be arranged inside the second recess 132, hence the environmental barrier structure 150 can cover the through hole provided by the first recess 131. The environmental barrier structure 150 may act as a mechanical or physical barrier for preventing undesired particles, dust, moisture and the like from entering the MEMS pressure transducer chip 100, which could otherwise damage the membrane 120.

The environmental barrier structure 150 may be provided as a (semi-)permeable compliant membrane, or a rigid mesh structure, or a membrane-joint mesh structure. The environmental barrier structure 150 may be provided as a separate component that may be attached to the substrate 110. Thus, the environmental barrier structure 150 can be a hybrid integrated environmental barrier structure, which is different from a monolithically integrated environmental barrier structure being directly structured into the substrate material 110.

Figure 2C:
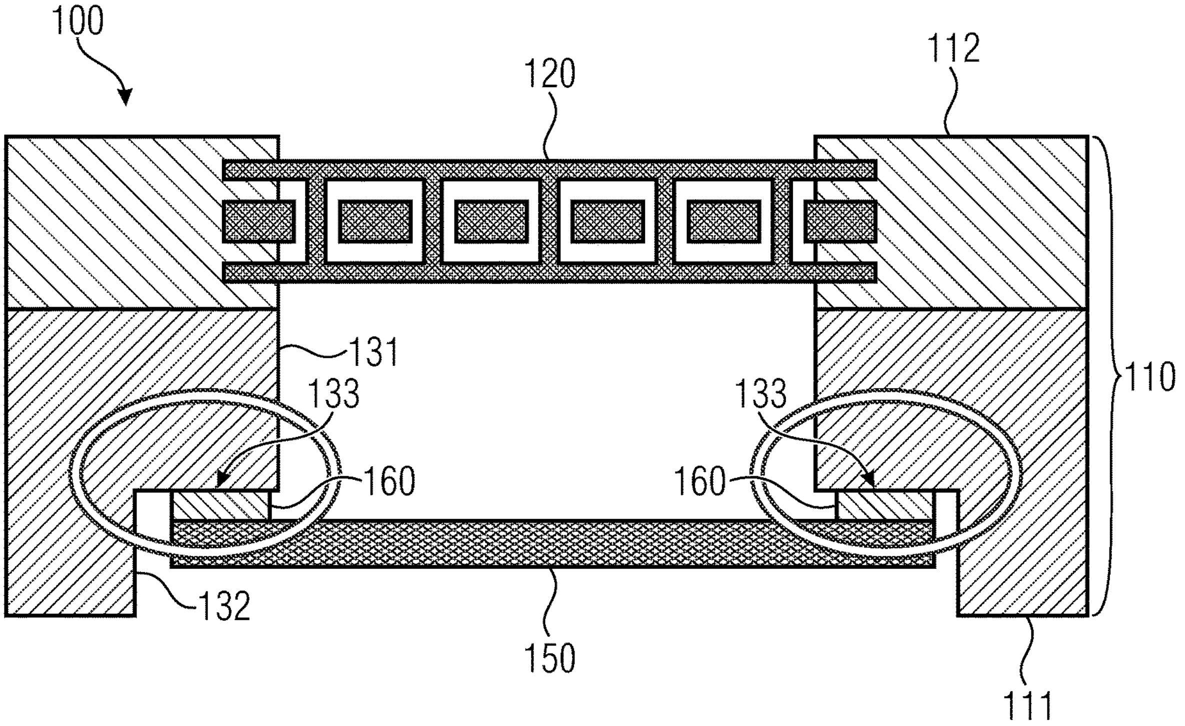

The environmental barrier structure 150 may be arranged inside the second recess 132 by means of an adhesive 160. As can be seen in FIG. 2C, the environmental barrier structure 150 may be attached to a collar 133 that is formed by the transition between the first recess 131 and the adjacent second recess 132 (see encircled regions).

Figure 3:
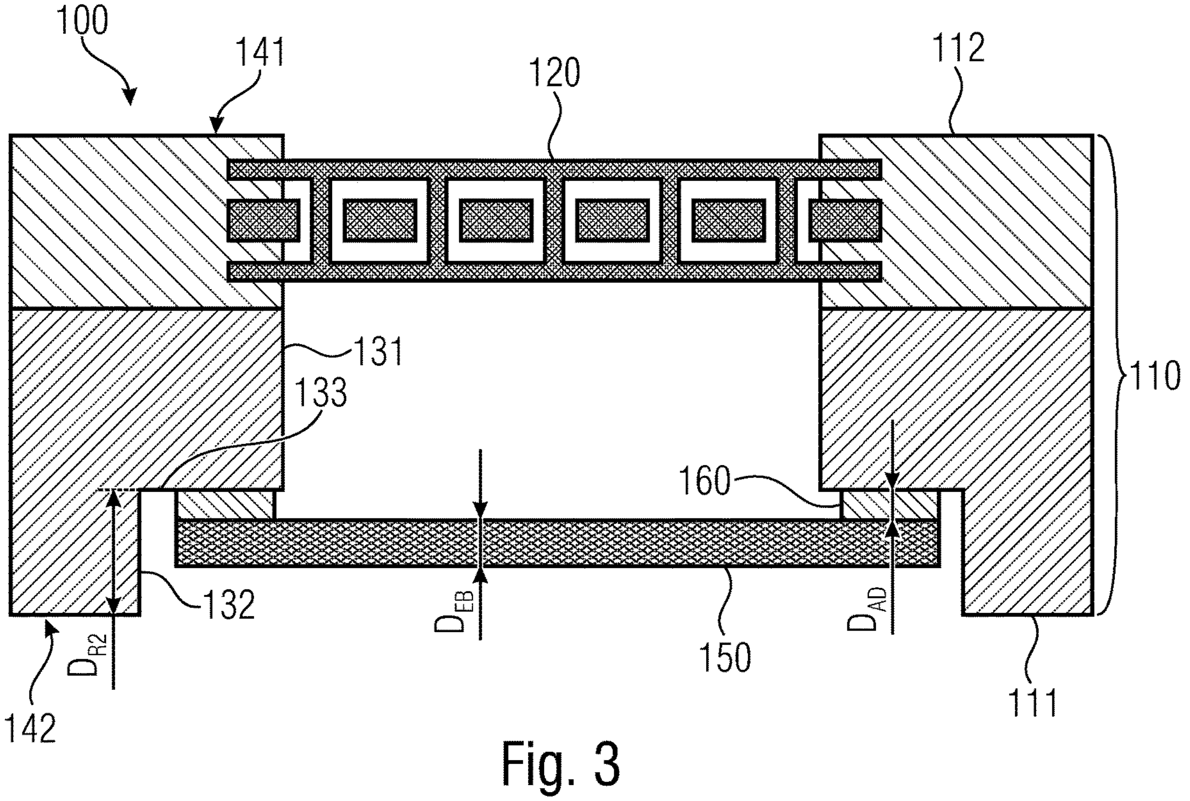
FIG. 3 shows a schematic side view of a MEMS pressure transducer chip comprising a hybrid integrated environmental barrier structure according to an embodiment.

As depicted in FIG. 3, the environmental barrier structure 150 may include a thickness $D_{EB}$ that is measured perpendicular to its lateral extension. Furthermore, the second recess 132 may include a depth $D_{R2}$ that is measured between the second, or bottom, surface 142 of the substrate 110 and the beginning of the first recess 131. More particular, the second recess 132 may include a depth $D_{R2}$ that is measured between the second, or bottom, surface 142 of the substrate 110 and the aforementioned collar 133.

According to an embodiment, the depth $D_{R2}$ of the second recess 132 may be as large as, or larger than, the thickness $D_{EB}$ of the environmental barrier structure 150. In some embodiments, the depth $D_{R2}$ of the second recess 132 may be as large as, or larger than, the thickness $D_{EB}$ of the environmental barrier structure 150 including the thickness $D_{AD}$ of the adhesive 160. Accordingly, the environmental barrier structure 150 may be located inside the second recess 132. In other words, the environmental barrier structure 150 may be located to avoid protruding from the second, or bottom, surface 142 of the substrate 110.

Figure 4A:
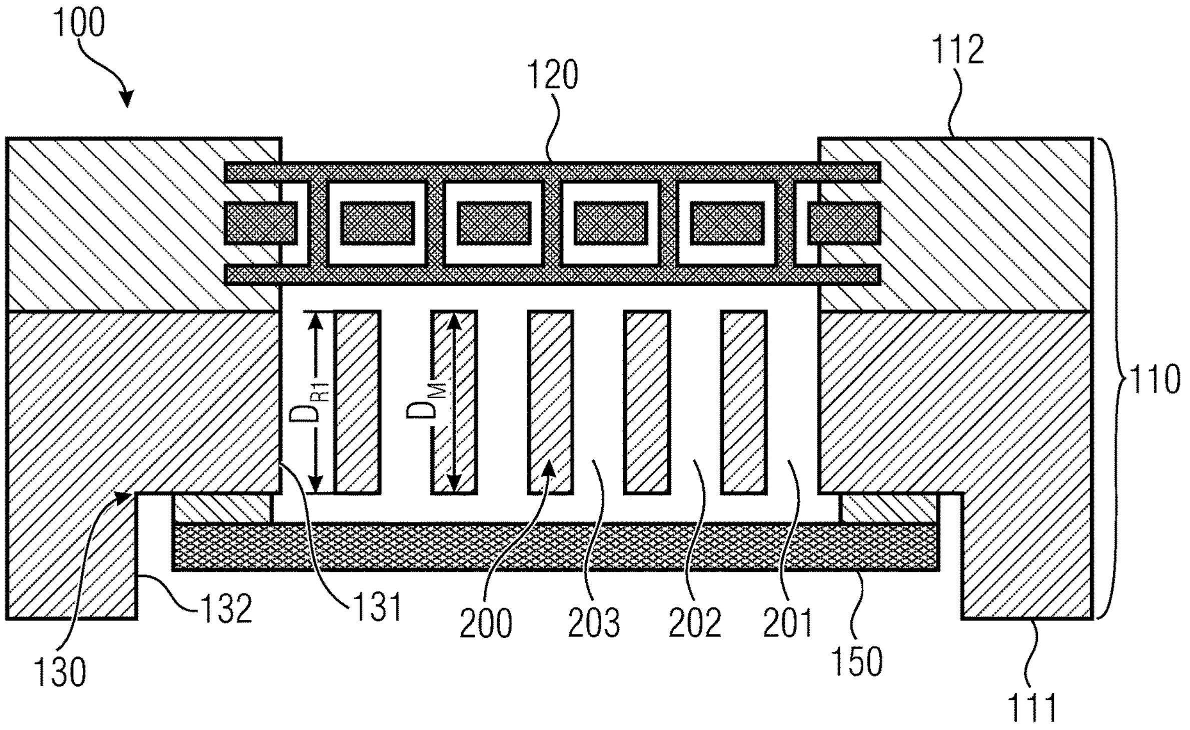
FIGS. 4A, 4B show schematic side views of a MEMS pressure transducer chip with an additional monolithically integrated perforated mesh structure according to an embodiment.
Figure 4B:
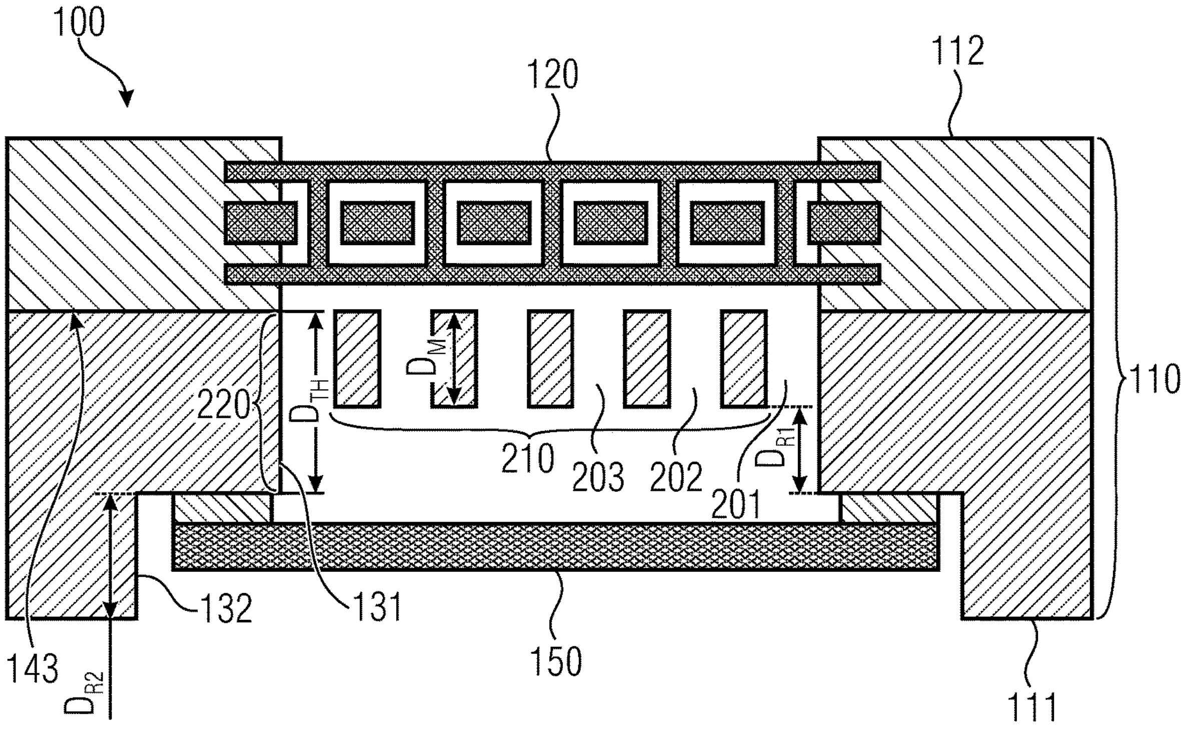

FIGS. 4A and 4B show further embodiments of the MEMS pressure transducer chip 100. Here, the pressure transducer chip 100 includes a monolithically perforated mesh structure 200. The mesh structure 200 may be formed integrally, i.e. monolithically, with the substrate 110. In other words, the mesh structure 200 may be structured into the substrate material. For example, the monolithic perforated mesh structure 200 may be provided in the first layer 111 of the substrate 110.

The mesh structure 200 may be provided in the stepped recess structure 130, in particular in the first recess 131. As can be seen in FIG. 4A, the first recess 131 may be created by structuring a plurality of perforations 201, 202, 203 into the substrate material. Accordingly, the remaining substrate material forms a monolithic perforated mesh structure 200 that resides inside the first recess 131. If the monolithic perforated mesh structure 200 is created in this manner, the mesh structure 200 includes a thickness $D_M$ that is as large as the depth $D_{R1}$ of the first recess 131, as shown in FIG. 4A. Alternatively, but not explicitly shown, the thickness $D_M$ of the mesh structure 200 may by either smaller or larger than the depth $D_{R1}$ of the first recess 131. In any case, the thickness $D_M$ may influence the mechanical robustness of the mesh structure 200.

The monolithically perforated mesh structure 200 of this embodiment can be created by a two-step etching process, for example by a two-step RIE or DRIE etching process (RIE: Reactive Ion Etching/DRIE: Deep Reactive Ion Etching). A first etching step may be used for etching the above mentioned plurality of perforations 201, 202, 203 into the substrate 110. The size (e.g., diameter) of the perforations 201, 202, 203 may be varied in the first etching step. As a result, the first recess 131 may be created as a through hole with an additional integrated perforated mesh structure 200. In this case, the depth of the through hole may correspond to the depth $D_{R1}$ of the first recess 131. Accordingly, the thickness $D_M$ of the mesh structure 200 may be as large as the depth of the vent hole, as depicted in FIG. 4A.

FIG. 4B shows an alternative approach of creating a thinner monolithic perforated mesh structure 200, which can be thinner than the depth of the through hole. In FIG. 4B, a three-step etching process, for example a three-step RIE or DRIE etching process, may be used for creating the mesh structure 200. In a first etching step the first recess 131 may be created, in a second etching step the second recess 132 may be created and in a third etching step the monolithic perforated mesh structure 200 may be created. The first, second and third etching steps may be performed sequentially in an arbitrary order.

Compared to the embodiments shown in FIGS. 2A to 2C and 3, the first recess 131 may be structured into the substrate 110 such that it does not extend completely through the substrate 110. Instead, the first recess 131 may be structured into the substrate 110 by a predetermined depth such that a substrate portion 210 remains between the first recess 131 and the membrane 120. In other words, the first recess 131 can be structured into the substrate 110 as a cavity that is closed at one end. Accordingly, at this stage, air cannot pass through the first recess 131 yet.

As can be seen in FIG. 4B, a plurality of perforations 201, 202, 203 may be structured into the remaining substrate portion 210 being located between the first recess 131 and the membrane 120. Thereby, the monolithically perforated mesh structure 200 may be created between the first recess 131 and the membrane 120. When the perforations 201, 202, 203 are structured into the remaining substrate portion 210 for creating the mesh structure 200, environmental air can pass through the first recess 131 and the mesh structure 200. Accordingly, a channel-like through hole 220 is formed through which environmental air can pass and enter the MEMS pressure transducer chip 100.

More particularly, a channel-like through hole 220 may be created with an additional integrated perforated mesh structure 200. Here, the depth $D_{TH}$ of the through hole 220 is larger than the thickness $D_M$ of the mesh structure 200. For comparison, the depth $D_{R1}$ of the first recess 131 and the depth $D_{R2}$ of the second recess 132 are also exemplarily depicted in FIG. 4B.

The through hole 220 may be defined as a portion of the substrate 110 extending between the collar 133 (at the step or transition between the first and second recesses 131, 132) and an upper surface 143 of the first substrate layer 111. The upper surface 143 may correspond to the surface facing the second substrate layer 112.

In both variants, as shown in FIGS. 4A and 4B, respectively, an additional (D)RIE process step may be performed to create the monolithically perforated mesh structure 200, wherein the duration of the applied process step can be adjusted to result in either a thick mesh structure (FIG. 4A) or a thin mesh structure (FIG. 4B).

The above discussed monolithic perforated mesh structure 200 may be advantageous to provide for an additional environmental barrier. Additionally or alternatively, the monolithically perforated mesh structure 200 may provide a mechanical stop in case of a deflectable environmental barrier structure 150, for example if the environmental barrier structure 150 is provided as a flexible and thus deflectable membrane with high compliance. In case the environmental barrier structure 150 is deflectable, the perforated mesh structure 200 may be monolithically integrated in the MEMS sound transducer chip 100 to act as a stopping layer for the environmental barrier structure 150.

For example, the mesh structure 200 may be rigid so as to avoid overbending of the deflectable environmental barrier structure 150, which may either damage the MEMS membrane 120 or deform the environmental barrier structure 150 itself, for example after being exposed to high air pressure or being immersed in water (e.g., depending on its deflection characteristic, the environmental barrier structure 150 may be overbent and may not return to its initial form and position). Thus, the perforated mesh structure 200 may also be referred to as a mesh based stopping-layer. As mentioned above, the thickness $D_M$ of the mesh structure 200 can be adjusted during the etching process to create either a thicker or a thinner mesh structure 200.

Summarizing, the embodiment as shown in FIG. 4A may include a thick monolithically integrated perforated mesh structure 200, which may include a thickness $D_M$ that is as large as, or even larger than, the depth $D_{R1}$ of the first recess 131. In turn, the embodiment as shown in FIG. 4B may include a thinner monolithically integrated perforated mesh structure 200, which may include a thickness $D_M$ that is smaller than the depth $D_{TH}$ of the through hole 220. The embodiment according to FIG. 4A may be fabricated by using a two-step RIE or DRIE process. The embodiment according to FIG. 4B may be fabricated by using a three-step RIE or DRIE process.

FIGS. 5A to 5G show some exemplary method steps of fabricating a MEMS pressure transducer chip 100 according to an embodiment. For ease of illustration, the MEMS pressure transducer chip 100 shown in FIGS. 5A to 5G does not include one of the above described monolithically integrated perforated mesh structures 200. However, it may also be possible that such a perforated mesh structure 200 may additionally be created in one of the steps of the process chain as shown in FIGS. 5A to 5G.

The method as described with reference to FIGS. 5A to 5G is performed on wafer level. Accordingly, the substrate 110 may be a wafer from which a plurality of MEMS pressure transducer chips 100A, 100B, 100C can be created.

Figure 5A:
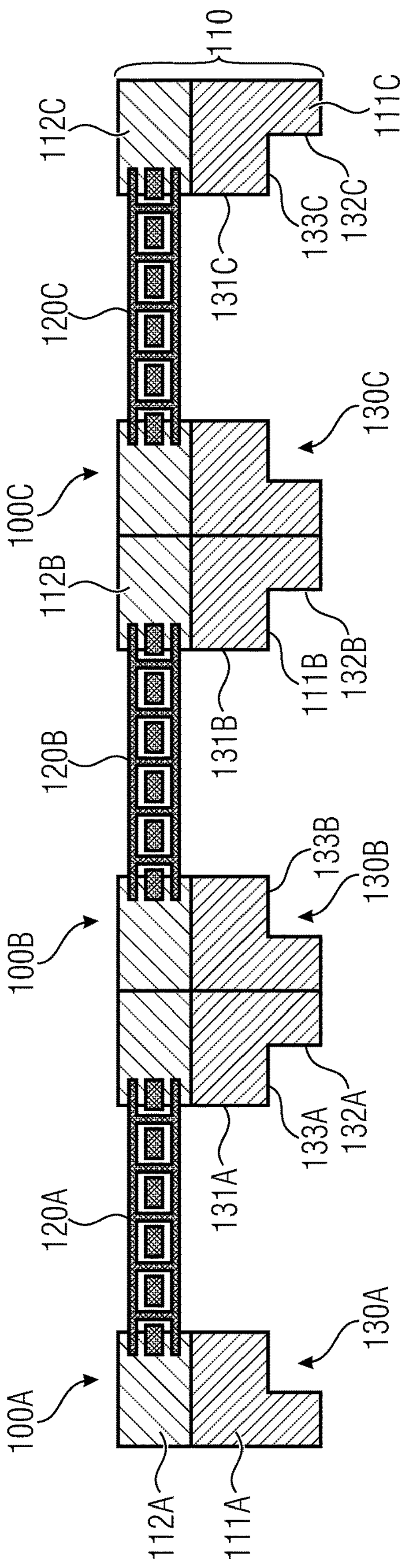
FIGS. 5A-5G show schematic side views of a process flow of a method for manufacturing an array of MEMS pressure transducer chips with hybrid integrated environmental barrier structures according to an embodiment.

FIG. 5A shows a first method step, wherein a plurality of MEMS pressure transducer chips are formed from a wafer substrate 110. In this non-limiting example, three connected MEMS pressure transducer chips 100A, 100B, 100C are shown, which are formed from a wafer substrate 110. However, a lot more than the exemplarily depicted three MEMS pressure transducer chips 110A, 100B, 100C may be formed from the wafer substrate 110. The plurality of chips may also be referred to as a chip array. The wafer substrate 110 may include a first layer 111 and a second layer 112. Accordingly, each of the MEMS pressure transducer chips 100A, 100B, 100C may include a first substrate layer 111A, 111B, 111C and a second substrate layer 112A, 112B, 112C.

Each MEMS pressure transducer chip 100A, 100B, 100C may include a stepped recess structure 130A, 130B, 130C being provided in the wafer substrate 110, and in particular in the second substrate layer 112. The stepped recess structures 130A, 130B, 130C may each include a first recess 131A, 131B, 131C and a larger or wider second recess 132A, 132B, 132C.

The stepped recess structure 130A, 130B, 130C, i.e., each of the first recesses 131A, 131B, 131C and the second recesses 132A, 132B, 132C, may be structured into the wafer substrate 110 by using a two-step etching process, such as a two-step RIE or DRIE process. In the two-step etching process, the first recess 131A, 131B, 131C may be etched in a first etching step, and the second recess 132A, 132B, 132C may be etched in a second etching step.

Instead of using an etching process, the stepped recess structure 130A, 130B, 130C may be created by a two-step subtractive micromachining process, e.g., by drilling, milling, grinding, laser ablation or the like that removes material. In this case, the first recess 131A, 131B, 131C may be created in a first subtractive micromachining process step, and the second recess 132A, 132B, 132C may be created in a second subtractive micromachining process step.

Etching processes may be preferred over physical micromachining processes since each one of the plurality of chips on a single wafer can be processed simultaneously. Meanwhile, for the micromachining method (e.g., laser processing), each one of the plurality of chips on a single wafer need to be processed sequentially, i.e. one after the other, which may result in longer processing time and higher fabrication cost.

Irrespective of whether etching or micromachining is used for creating the stepped recess structure 130A, 130B, 130C, the above discussed monolithically integrated perforated mesh structure 200 may additionally be provided here. For example, the thicker mesh structure 200 of FIG. 4A may be created during formation of the first recess 131A, 131B, 131C, as described above. In turn, the thinner mesh structure 200 of FIG. 4B may be created in a third step, wherein the first recesses 131A, 131B, 131C and the second recesses 132A, 132B, 132C are created in the first and second steps, while the perforated mesh structure 200 is created in a third step. In case etching is used, all the chips on a single wafer can be processed simultaneously. Depending on the size of the processed wafer and the used etching machine, the holding plate inside the etching chamber may be employed for placing more than one wafer. However, wafers containing a number of chips may be processed sequentially (i.e., one wafer is processed after the other), possibly in an arbitrary order.

Since FIG. 5A exemplarily shows MEMS pressure transducer chips 100A, 100B, 100C without any monolithically integrated perforated mesh structures 200, a two-step or double structuring process (e.g., RIE or DRIE process) may be used for creating the stepped recess structures 130A, 130B, 130C comprising the first recesses 131A, 131B, 131C and the second recesses 132A, 132B, 132C and the above discussed collars 133A, 133B, 133C, at which the environmental barrier structure can be later attached in a hybrid fashion. As an alternative technique, laser micromachining may be used for creating the stepped recess structures 130A, 130B, 130C. However, the laser micromachining may have a drawback, in which the chips are processed sequentially one by one. Despite the possibility to introduce more than one laser source during the micromachining process, laser micromachining may lead to higher fabrication cost. In turn, using an etching process instead, the first recesses 131A, 131B, 131C and the second recesses 132A, 132B, 132C on the chip arrays can be created simultaneously.

Figure 5B:
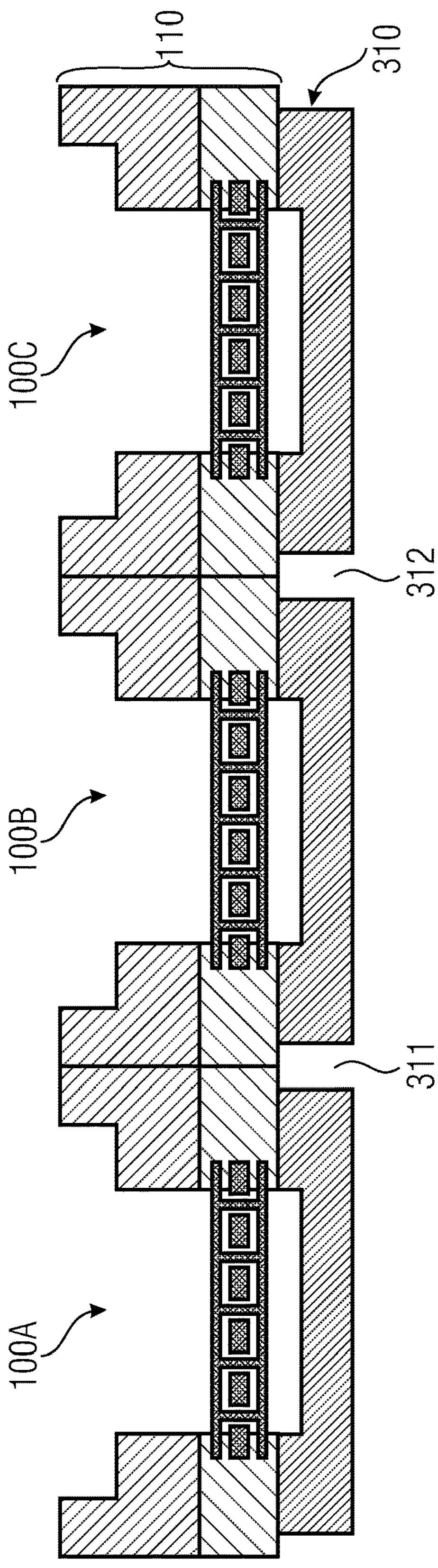

FIG. 5B shows a step of flip and alignment of the wafer 110 onto a wafer carrier 310. Here, the MEMS pressure transducer chips 100A, 100B, 100C are flipped and aligned onto the wafer carrier 310 comprising vacuum holes 311, 312 for sucking and fixing the wafer 110 during wafer handling, e.g., during any of the subsequent steps like attaching the hybrid environmental barrier structure. In this step (FIG. 5B), different materials may be used for the wafer carrier 310, such as metal, glass, silicon, porous ceramic, or Teflon®.

Figure 5C:
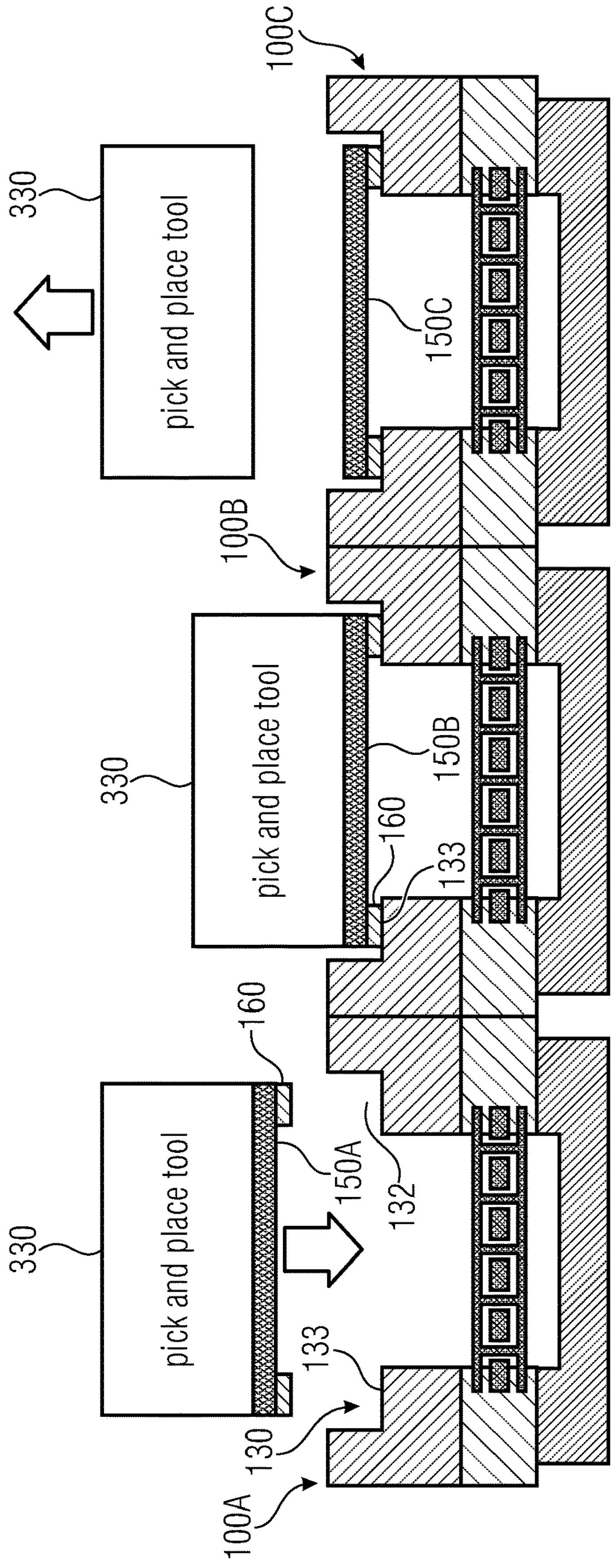

FIG. 5C shows a further method step, in which the environmental barrier structures 150A, 150B, 150C are attached sequentially to the MEMS pressure transducer chips 100A, 100B, 100C, e.g., by means of a pick and place tool 330.

As can be seen on the left side of FIG. 5C, the pick and place tool 330 may pick and carry a hybrid environmental barrier structure denoted with reference numeral 150A. The pick and place tool 330 may align the hybrid environmental barrier structure 150A with the collar 133 formed in the stepped recess structure 130 of each MEMS pressure transducer chip 100A, 100B, 100C. The environmental barrier structure 150A may include a bonding means (e.g., an adhesive) 160 at a surface facing the collar 133 formed in the stepped recess structure 130.

As shown in the middle of FIG. 5C, the pick and place tool 330 may place the environmental barrier structure, here denoted with reference numeral 150B, onto the collar 133 such that the adhesive 160 is adhered to the collar 133. Accordingly, the step of arranging the environmental barrier structures 150A, 150B, 150C inside the second recess 132 may include a step of applying a bonding means 160 at a rim area of the environmental barrier structures 150A, 150B, 150C and attaching the environmental barrier structures 150A, 150B, 150C with the applied bonding means 160 directly to the substrate material.

Since the environmental barrier structures 150A, 150B, 150C are prepared with an adhesive carrier 160 at their rim, the environmental barrier structures 150A, 150B, 150C can be directly attached to the substrate material (e.g., silicon) without dispensing additional glue inside the stepped recess structure 130. Here, some parameter adjustments may be observed to precisely integrate the environmental barrier structure 150B without damaging the MEMS pressure transducer chips 100A, 100B, 100C, which may include geometry, applied force, and speed of the pick and place technique.

As depicted on the right side of FIG. 5C, the pick and place tool 330 may be released and removed once the environmental barrier structure, here denoted with reference numeral 150C, is attached to the MEMS pressure transducer chips 100A, 100B, 100C.

The environmental barrier structures 150A, 150B, 150C may be provided as a flexible compliant membrane, a rigid mesh, or combination of both depending on the desired environmental robustness requirements/properties. Materials that may be used for the environmental barrier structures 150A, 150B, 150C may include, but are not limited to, different polymers (e.g., polytetrafluoroethylene (PTFE), polyacrylonitrile (PAN), polyvinylidene difluoride (PVDF), and polyimide), carbon, silicon, metal oxide, nitride, and two-dimensional (2D) materials (e.g., graphene and platinum diselenide ($PtSe_2$)). The environmental barrier structures 150A, 150B, 150C can be provided in nanostructured form.

Figure 5D:
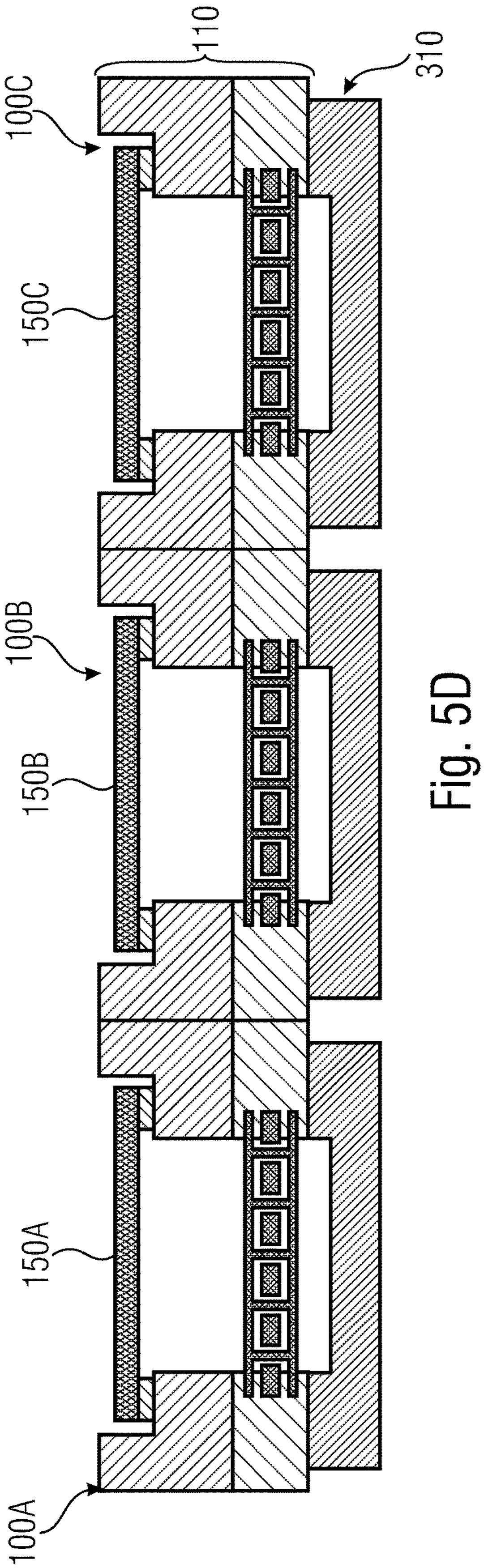

FIG. 5D shows an array of MEMS pressure transducer chips 100A, 100B, 100C, each having the hybrid integrated environmental barrier structures 150A, 150B, 150C attached. The wafer 110 is now ready to be transferred to a lamination treatment.

Figure 5E:
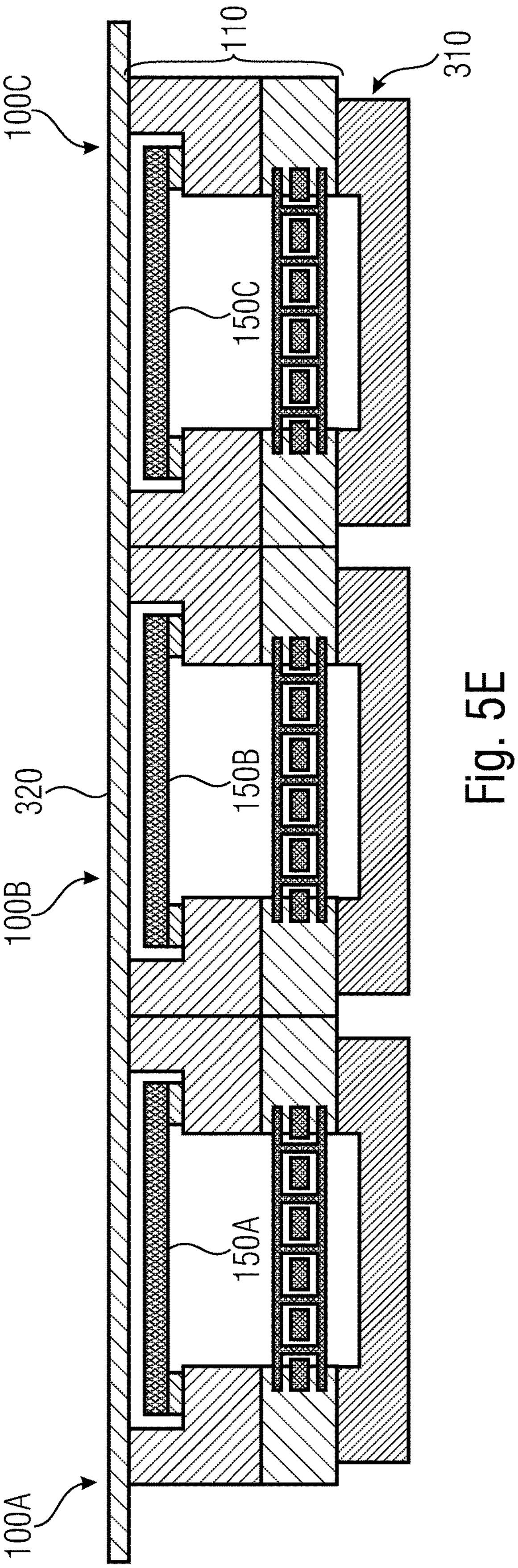

FIG. 5E shows a step of wafer lamination onto a foil 320. In FIG. 5E, the wafer 110 comprising the MEMS pressure transducer chips 100A, 100B, 100C, each being equipped with the environmental barrier structures 150A, 150B, 150C, may be laminated onto a foil 320, while the wafer 110 may still be fixed to the vacuum wafer carrier 310.

Figure 5F:
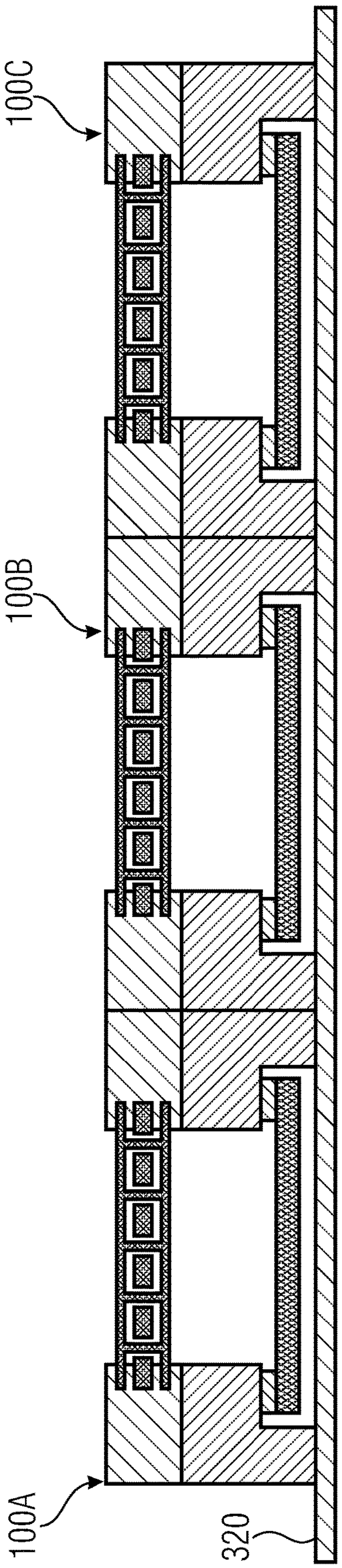

FIG. 5F shows a further method step in which the laminated wafer 110 is released from the wafer carrier 310. After the wafer 110 has been completely laminated, the wafer vacuum carrier 310 may be removed. In FIG. 5F the wafer 110 is vertically flipped by 180°.

Figure 5G:
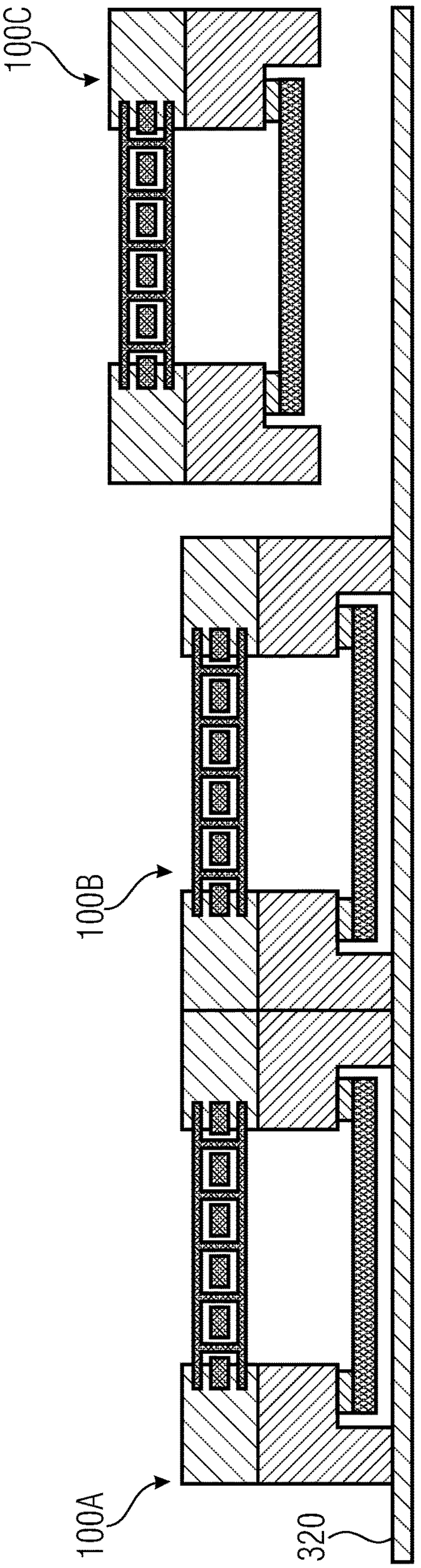

FIG. 5G shows a step of singulating the laminated MEMS pressure transducer chips 100A, 100B, 100C, e.g., by dicing, for yielding single MEMS die. The singulated MEMS pressure transducer chips 100A, 100B, 100C are then ready to be completely released from the laminating foil 320 during the pick and place process. Here, the MEMS pressure transducer chips 100A, 100B, 100C are separated, while the laminating foil 320 can remain in place. The singulated (e.g., diced) MEMS pressure transducer chips 100A, 100B, 100C may then be placed onto a PCB using a pick-and-place tool for creating a MEMS pressure transducer package.

Figure 6:
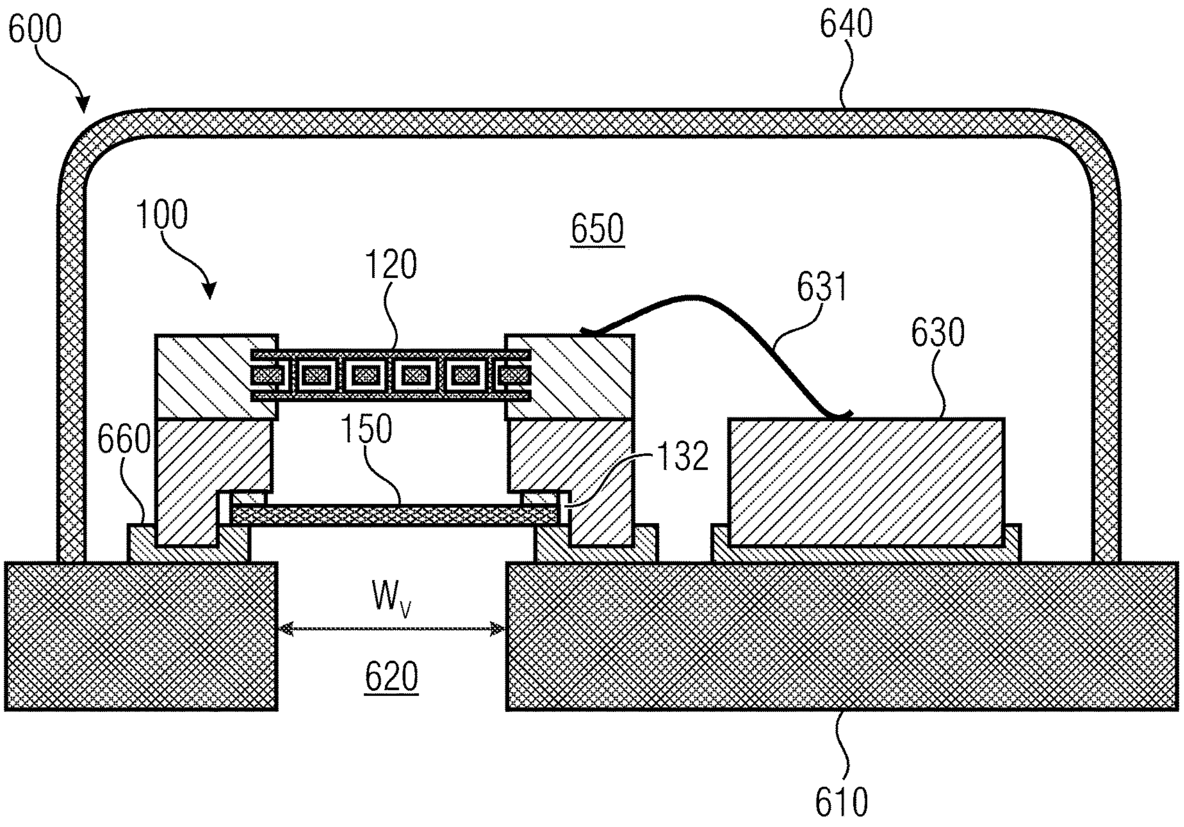
FIG. 6 shows a schematic side view of a MEMS pressure transducer package comprising a MEMS pressure transducer chip according to an embodiment.

FIG. 6 shows a MEMS pressure transducer package 600 comprising a MEMS pressure transducer chip 100 as described herein. The package 600 includes a component substrate 610, e.g., a printed circuit board (PCB) substrate. A circuitry 630, e.g., an application-specific integrated circuit (ASIC), may be arranged adjacent to the MEMS pressure transducer chip 100. The circuitry 630 and the MEMS pressure transducer chip 100 may be electrically connected to each other via a bond wire 631. A metal lid 640 may be placed on the component substrate 610, such that it covers the MEMS pressure transducer chip 100 and the circuitry 630. In case the MEMS pressure transducer chip 100 is configured as a MEMS microphone, the cavity or space 650 underneath the lid 640 may be referred to as a back volume.

The component substrate 610 may include a vent hole 620 through which ambient air or pressure waves from the environment may pass and enter the back volume 650 underneath the lid. Additionally or alternatively, a vent hole may be provided in the lid 640. In case the MEMS pressure transducer chip 100 is configured as a MEMS microphone, the vent hole 620 may be referred to as a sound port.

The MEMS pressure transducer chip 100 may be attached to the component substrate 610, such that it covers the vent hole 620. In particular, the MEMS pressure transducer chip 100 may be arranged such that the hybrid integrated environmental barrier structure 150 faces the vent hole 620. Thus, the environmental barrier structure 150 may prevent undesired particles, dust, moisture and the like, that may have passed through the vent hole 620, from reaching the membrane 120 of the MEMS pressure transducer chip 100.

The vent hole 620 may include a width $W_V$ that is smaller, or as large as, the width $W_2$ of the second recess 132 (FIG. 2A). Thus, the environmental barrier structure 150 may completely cover the vent hole 620 for securely protecting the MEMS pressure transducer chip 100 from ingress of foreign matters.

Though not explicitly shown, the MEMS pressure transducer chip 100 may optionally include a monolithically integrated perforated mesh structure 200 as discussed above with reference to FIGS. 4A and 4B.

It is an advantage of the above described packaging concept that one pick-and-place step is performed on PCB level, since the environmental barrier structure 150 is hybrid integrated into the MEMS pressure transducer chip 100. In conventional systems, as shown in prior art FIGS. 1A and 1B, the environmental barrier 90 is provided as a discrete component that is separate from the MEMS chip 20. Thus, in conventional systems, one pick-and-place step is performed for placing the environmental barrier 90 at the PCB 30, and one further pick-and-place step is performed for placing the MEMS chip 20 at the PCB 30, resulting in two pick-and-place steps, which can be undesirable. Furthermore, as shown in FIG. 1B, the discrete environmental barrier 90 consumes some amount of space underneath the lid 60, which reduces the available back volume, which can be undesirable.

In the herein described embodiments, a hybrid integrated environmental barrier structure 150 may result in no reduction of back volume, i.e., the same back volume as compared to bare MEMS die can be maintained (particularly the distance between the MEMS membrane 120 with the inner part of the metal lid 640).

As can further be seen in FIG. 6, the bottom part of the MEMS pressure transducer chip 100 may be attached to the component substrate 610 (e.g., PCB) using a bonding means 660, for instance, at least one of glue, adhesive, or a silicone elastomer, such as Elastosil®. As can be seen at the inside of the second recess 132, a rim region of the flipped environmental barrier structure 150 may also be connected and supported by the same bonding means 660, which potentially leads to a stable and robust anchoring of the environmental barrier structure 150.

Figure 7:
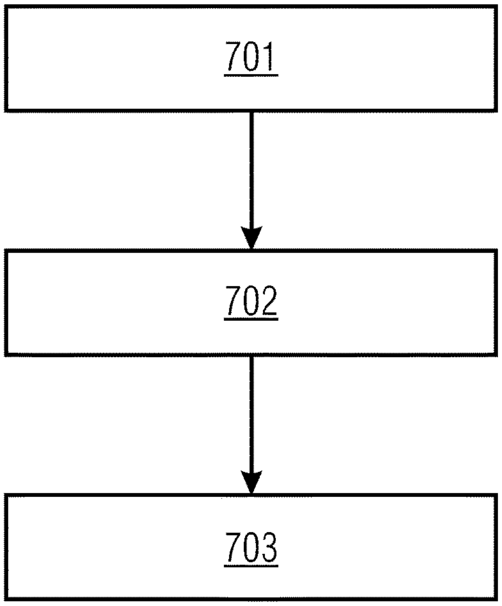
FIG. 7 shows a block diagram for visualizing a method for manufacturing a MEMS pressure transducer chip comprising a hybrid integrated environmental barrier structure according to an embodiment.

FIG. 7 shows a block diagram of a method as described herein, i.e., a method for manufacturing a MEMS pressure transducer chip 100 with a hybrid integrated environmental barrier structure 150. Some method steps may comply with the method steps as discussed above with reference to FIGS. 5A to 5G, while some of the above described methods steps may rather be optional.

In block 701, a substrate 110 is provided, the substrate 110 including at least one membrane 120.

In block 702, a stepped recess structure 130 is structured into the substrate 110, the stepped recess structure 130 including a first recess 131 having a first lateral width $W_1$ and an adjacent second recess 132 having a larger second lateral width $W_2$, where the stepped recess structure 130 extends between the membrane 120 and a substrate surface 142 opposite to the membrane 120.

In block 703, an environmental barrier structure 150 is arranged inside the second recess 132.

Summarizing, as disclosed herein, a method for manufacturing a MEMS pressure transducer chip 100 includes an hybrid integrated environmental barrier structure 150. The method and the resulting MEMS pressure transducer chip 100 are referred to as 'hybrid' because the environmental barrier structure 150 may be fabricated separately as a discrete component/device (i.e., not monolithically integrated in the MEMS chip 100). The discrete environmental barrier structure 150 may be hybrid integrated into the MEMS pressure transducer chip 100. For instance, the environmental barrier structure 150 may be directly attached to the second cavity 132 resulting in a straightforward integration process at a later packaging stage. The second cavity 132 may be created using e.g., reactive ion etching (RIE), laser micromachining, or other physical/chemical microprocessing techniques. In terms of RIE, inductively coupled plasma (ICP) cryogenic or Bosch RIE processes can be used.

The stepped recess structure 130 comprising the two recesses 131, 132 (also referred to as backside-cavities) may provide a pocket/holder for the discrete environmental barrier structure 150. The first recess 131 may either be a conventional cylindrical Bosch hole (FIGS. 2A-3, and 5A-6), or it may include a multitude of smaller sized holes 201, 202, 203 forming a mesh structure 200 that may act as a stopper for large deflections of the environmental barrier structure 150 (FIGS. 4A and 4B).

The methods and structures disclosed herein can be applied in sealed dual membrane (SDM) technology, in single backplate (SBP), double-backplate (DBP), and other possible MEMS-based membrane technologies that have semiconductor materials (silicon) or other (e.g., glass) as a substrate 110 to be structured using double or triple backside etching process or other physical/chemical micromachining techniques.

The embodiments disclosed herein may provide for MEMS pressure transducer chips 100 (e.g., MEMS microphone chips) with a hybrid integrated environmental barrier structure 150 directly on a wafer 110 during delivery. Thus, during manufacturing and assembly, additional integration steps like stacking of the environmental barrier structure 150 and the MEMS pressure transducer chip 100 on a PCB (FIG. 1B) may be avoided. The embodiments disclosed herein of a packaging process and procedure at the back-end-of-line (BEOL) can be implemented in existing production lines, in some instances.

The present disclosure may have some further advantages. A packaging process can be done in a simple way, such that wafers can be produced with 'normal' appearance from the top view (e.g., indistinguishable between bare MEMS die and MEMS dies 100 comprising the hybrid integrated environmental barrier structure 150 from a top view without magnification). Thus, existing logistics and integration concepts of an environmental barrier structure 150 can be used, because the diced MEMS pressure transducer chips 100 having the hybrid integrated environmental barrier structure 150 can be treated the same or similarly as other wafers during the joining process for the metal lid.

An existing back-volume can be maintained. The back-volume of the MEMS pressure transducer chips 100 can be the same as other MEMS die. In prior art FIG. 1B (stacking the environmental barrier 90 between PCB 30 and MEMS chip 20), the back-volume may be reduced.

A monolithically integrated perforated mesh structure 200 can increase the robustness of the MEMS pressure transducer chip 100. In the chip variants with integrated silicon mesh 200 (see FIGS. 4A and 4B), the mesh 200 can act as a stopping layer for the flexible environmental barrier structure 150 during its deflection. Hence, the MEMS membrane 120 can be protected if the environmental barrier structure 150 deflects to its maximum displacement. Moreover, such embodiments can avoid overbending of the environmental barrier structure 150 under very high air pressure, which can lead to irreversible deformation. These advantages may increase the robustness or lifetime of both the environmental barrier structure 150 and the MEMS membrane 120.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

While this disclosure has been described with reference to illustrative embodiments, this description is not intended to be construed in a limiting sense. Various modifications and combinations of the illustrative embodiments, as well as other embodiments of this disclosure, are contemplated upon reference to the description.

What is claimed is:

1. A method for manufacturing a MEMS pressure transducer chip with a hybrid integrated environmental barrier structure, the method comprising:

providing a substrate comprising at least one membrane;

structuring a stepped recess structure into the substrate, the stepped recess structure comprising a first recess having a first lateral width and a second recess adjacent to the first recess, the second recess having a second lateral width larger than the first lateral width, sidewalls of the first recess being parallel to sidewalls of the second recess, wherein the stepped recess structure extends between the membrane and a substrate surface opposite the membrane, the membrane extending between opposite sidewalls of the substrate, the opposite sidewalls of the substrate extending above and below the membrane, the opposite sidewalls of the substrate being separated by the first lateral width; and arranging an environmental barrier structure inside the second recess.

2. The method of claim 1, wherein arranging the environmental barrier structure inside the second recess further comprises:

attaching the environmental barrier structure to a collar that is formed by a transition from the first recess to the adjacent second recess.

3. The method of claim 1, wherein arranging the environmental barrier structure inside the second recess further comprises:

applying a bonding layer at a rim area of the environmental barrier structure; and attaching the environmental barrier structure with the bonding layer applied directly to material of the substrate.

4. The method of claim 1, wherein arranging the environmental barrier structure inside the second recess further comprises:

arranging the environmental barrier structure inside the second recess such that the environmental barrier structure covers the first recess.

5. The method of claim 1, wherein structuring the stepped recess structure into the substrate further comprises:

creating the second recess with a depth that is as large as, or larger than, a thickness of the environmental barrier structure, wherein the environmental barrier structure is located inside the second recess.

6. The method of claim 1, wherein structuring the stepped recess structure further comprises:

creating the first recess by structuring a plurality of perforations into the substrate for creating a monolithic perforated mesh structure located inside the first recess, the monolithic perforated mesh structure having a thickness that is as large as a depth of the first recess.

7. The method of claim 1, wherein structuring the stepped recess structure further comprises:

structuring a plurality of perforations into a substrate portion located between the first recess and the membrane for creating a monolithic perforated mesh structure between the first recess and the membrane.

8. The method of claim 1, wherein structuring the stepped recess structure further comprises:

an etching process, wherein the first recess is etched in a first etching step of the etching process, and the second recess is etched in a second etching step of the etching process.

9. The method of claim 1, wherein structuring the stepped recess structure further comprises:

a subtractive micromachining process, wherein the first recess is created in a first step of the subtractive micromachining process, and the second recess is created in a second step of the subtractive micromachining process.

10. A MEMS pressure transducer chip with a hybrid integrated environmental barrier structure, the MEMS pressure transducer chip comprising:

a substrate comprising at least one membrane, the at least one membrane having a first lateral width between opposite sidewalls of the substrate, the opposite sidewalls of the substrate extending above and below the at least one membrane;

the substrate comprising a stepped recess structure, the stepped recess structure further comprising a first recess having the first lateral width and an adjacent second recess having a second lateral width larger than the first lateral width, wherein sidewalls of the first recess are continuous with the opposite sidewalls of the substrate, wherein the sidewalls of the first recess are parallel with sidewalls of the second recess, and wherein the stepped recess structure extends between the membrane and a substrate surface opposite the membrane; and an environmental barrier structure located inside the second recess.

11. The MEMS pressure transducer chip of claim 10, wherein the environmental barrier structure located inside the second recess covers the first recess.

12. The MEMS pressure transducer chip of claim 10, further comprising:

a monolithic perforated mesh structure residing inside the first recess, wherein the first recess comprises a depth that is as large as, or larger than, or smaller than a thickness of the monolithic perforated mesh structure.

13. The MEMS pressure transducer chip of claim 10, wherein the environmental barrier structure comprises at least one of a flexible membrane and a rigid mesh.

14. The MEMS pressure transducer chip of claim 10, wherein the MEMS pressure transducer chip is a MEMS microphone chip comprising a flexible microphone membrane.

15. A MEMS pressure transducer package housing a MEMS pressure transducer chip, the MEMS pressure transducer chip comprising:

a substrate comprising at least one membrane, the at least one membrane extending between sidewalls of the substrate, the sidewalls being separated by a first lateral width, the sidewalls of the substrate extending above and below the at least one membrane;

the substrate comprising a stepped recess structure, the stepped recess structure further comprising a first recess having the first lateral width and a second recess adjacent to the first recess, sidewalls of the first recess being continuous with the sidewalls of the substrate, the second recess having a second lateral width larger than the first lateral width, wherein sidewalls of the second recess are parallel to the sidewalls of the first recess, and wherein the stepped recess structure extends between the membrane and a substrate surface opposite the membrane; and an environmental barrier structure located inside the second recess.

16. The MEMS pressure transducer package of claim 15, wherein the environmental barrier structure located inside the second recess covers the first recess.

17. The MEMS pressure transducer package of claim 15, further comprising:

a monolithic perforated mesh structure residing inside the first recess, wherein the first recess comprises a depth that is as large as, or larger than, or smaller than a thickness of the monolithic perforated mesh structure.

18. The MEMS pressure transducer package of claim 15, wherein the environmental barrier structure comprises at least one of a flexible membrane and a rigid mesh.

19. The MEMS pressure transducer package of claim 15, wherein the MEMS pressure transducer chip is a MEMS microphone chip comprising a flexible microphone membrane.

20. The MEMS pressure transducer package of claim 15, wherein the MEMS pressure transducer chip is mounted on a package substrate comprising a printed-circuit board (PCB).

* * * * *